(12) United States Patent
Sugo et al.

(10) Patent No.: US 12,187,989 B2
(45) Date of Patent: *Jan. 7, 2025

(54) CLEANING SOLUTION FOR TEMPORARY ADHESIVE FOR SUBSTRATES, SUBSTRATE CLEANING METHOD, AND CLEANING METHOD FOR SUPPORT OR SUBSTRATE

(71) Applicant: Shin-Etsu Chemical Co., Ltd., Tokyo (JP)

(72) Inventors: Michihiro Sugo, Annaka (JP); Masahito Tanabe, Annaka (JP); Shohei Tagami, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 376 days.

This patent is subject to a terminal disclaimer.

(21) Appl. No.: 17/603,242

(22) PCT Filed: May 20, 2020

(86) PCT No.: PCT/JP2020/019988
§ 371 (c)(1),
(2) Date: Oct. 12, 2021

(87) PCT Pub. No.: WO2020/235606
PCT Pub. Date: Nov. 26, 2020

(65) Prior Publication Data
US 2022/0195352 A1    Jun. 23, 2022

(30) Foreign Application Priority Data

May 22, 2019    (JP) ................................. 2019-096056

(51) Int. Cl.
*C11D 3/24*    (2006.01)
*B08B 3/08*    (2006.01)
(Continued)

(52) U.S. Cl.
CPC .............. *C11D 7/5009* (2013.01); *B08B 3/08* (2013.01); *C11D 3/2068* (2013.01);
(Continued)

(58) Field of Classification Search
CPC ................ C11D 3/2072; C11D 3/2068; C11D 3/2093; C11D 7/263; C11D 7/266; C11D 7/264; C11D 7/28; C11D 3/30
(Continued)

(56) References Cited

U.S. PATENT DOCUMENTS

| | | | |
|---|---|---|---|
| 2006/0014656 A1 | 1/2006 | Egbe et al. | |
| 2008/0039356 A1* | 2/2008 | Palmer ................. | C11D 7/3209 510/424 |

(Continued)

FOREIGN PATENT DOCUMENTS

| | | |
|---|---|---|
| JP | 2003-174003 A | 6/2003 |
| JP | 2009-224793 A | 10/2009 |

(Continued)

OTHER PUBLICATIONS

International Search Report for PCT/JP2020/019988 mailed on Aug. 4, 2020.
(Continued)

*Primary Examiner* — Gregory R Delcotto
(74) *Attorney, Agent, or Firm* — Birch, Stewart, Kolasch & Birch, LLP

(57) ABSTRACT

A cleaning solution for temporary adhesive for substrates contains: tetrabutylammonium fluoride; dimethyl sulfoxide; and a liquid compound having a solubility parameter of 8.0 or more and 10.0 or less and having a heteroatom. The tetrabutylammonium fluoride is preferably contained at a content of 1 mass % or more and 15 mass % or less in 100 mass % of a total of the tetrabutylammonium fluoride, the dimethyl sulfoxide, and the liquid compound. The dimethyl (Continued)

sulfoxide is preferably contained at a content of 5 mass % or more and 30 mass % or less in 100 mass % of a total of the tetrabutylammonium fluoride, the dimethyl sulfoxide, and the liquid compound.

4 Claims, 1 Drawing Sheet

(51) Int. Cl.

| | |
|---|---|
| *C11D 3/20* | (2006.01) |
| *C11D 3/30* | (2006.01) |
| *C11D 3/34* | (2006.01) |
| *C11D 3/43* | (2006.01) |
| *C11D 3/44* | (2006.01) |
| *C11D 7/26* | (2006.01) |
| *C11D 7/28* | (2006.01) |
| *C11D 7/50* | (2006.01) |
| *H01L 21/02* | (2006.01) |

(52) U.S. Cl.
CPC .......... *C11D 3/2072* (2013.01); *C11D 3/2093* (2013.01); *C11D 3/30* (2013.01); *C11D 7/263* (2013.01); *C11D 7/264* (2013.01); *C11D 7/266* (2013.01); *C11D 7/28* (2013.01); *C11D 7/5013* (2013.01); *C11D 7/5022* (2013.01); *H01L 21/02079* (2013.01); *B08B 2220/01* (2013.01); *C11D 2111/14* (2024.01)

(58) Field of Classification Search
USPC .......................... 510/134, 238, 504, 505, 506
See application file for complete search history.

(56) References Cited

U.S. PATENT DOCUMENTS

| | | |
|---|---|---|
| 2011/0311921 A1 | 12/2011 | Egbe et al. |
| 2014/0357052 A1 | 12/2014 | Ueno et al. |
| 2014/0374031 A1 | 12/2014 | Chiou et al. |
| 2017/0130174 A1 | 5/2017 | Ueno et al. |
| 2017/0158888 A1 | 6/2017 | Kang et al. |
| 2019/0062674 A1* | 2/2019 | Dory .................... C11D 7/3281 |

FOREIGN PATENT DOCUMENTS

| | | |
|---|---|---|
| JP | 2015-7217 A | 1/2015 |
| KR | 10-2014-0060389 A | 5/2014 |
| WO | WO 2014/092022 A1 | 6/2014 |

OTHER PUBLICATIONS

Written Opinion of the International Searching Authority for PCT/JP2020/019988 mailed on Aug. 4, 2020.
Japanese Office Action for Japanese Application No. 2019-096056, dated Jul. 19, 2022, with English translation.
Extended European Search Report dated Jun. 14, 2023 for Application No. 20810598.1.
Chinese Office Action and Search Report for Chinese Application No. 202080036909.6, dated Feb. 8, 2024, with English translation.
Taiwanese Office Action and Search Report for Taiwanese Application No. 109116861, dated Mar. 1, 2024, with an English translation.
Chinese Office Action (including an English translation thereof) issued in the corresponding Chinese Patent Application No. 202080036909.6 on Sep. 30, 2024.

* cited by examiner

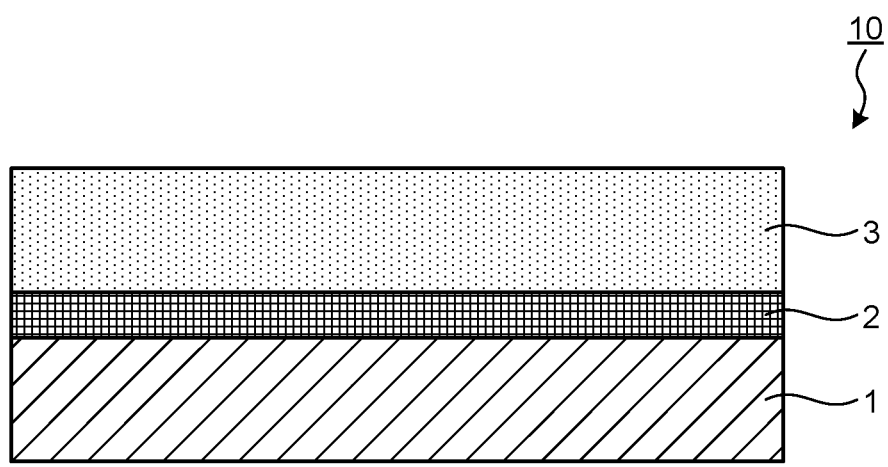

CLEANING SOLUTION FOR TEMPORARY ADHESIVE FOR SUBSTRATES, SUBSTRATE CLEANING METHOD, AND CLEANING METHOD FOR SUPPORT OR SUBSTRATE

FIELD

The present invention relates to a cleaning solution for temporary adhesive for substrates, a substrate cleaning method, and a cleaning method for a support or a substrate.

BACKGROUND

Three-dimensional semiconductor mounting has become essential for a higher density and a larger capacity. The three-dimensional mounting technique is a semiconductor production technique for thinning one semiconductor chip and then connecting the chip to another chip by a through silicon via (TSV) to form a multilayer. To realize this technique, steps of grinding a non-circuit-forming surface (also referred to as "back surface", herein) of a substrate on which a semiconductor circuit has been formed to thin the substrate, and then forming an electrode including a TSV on the back surface are required. Conventionally, in the step of grinding the back surface of a silicon substrate, a protective tape for the back surface is attached to a side opposite to the surface to be ground to prevent the wafer from breaking during grinding. However, this tape uses an organic resin film as the base material, which has flexibility, but insufficient strength and heat resistance. Thus, it is not suited to the step of forming a TSV or forming a wiring layer on the back surface.

In this context, a system has been proposed in which a semiconductor substrate is bonded to a support made of silicon, glass, or the like with an adhesive layer interposed therebetween, to sufficiently withstand the steps of grinding the back surface and forming a TSV and an electrode on the back surface. In this system, the adhesive layer used for bonding the substrate to the support is important. The adhesive layer requires a sufficient durability to bond the substrate to the support without gaps and to withstand subsequent steps. Furthermore, the ability to easily separate a thin wafer from the support finally is required. Herein, the adhesive layer is also referred to as a "temporary adhesive layer" because it is finally separated.

After the support is separated, a part of the temporary adhesive layer may remain on a front surface of the substrate on which the semiconductor circuit has been formed. Generally, such a remaining temporary adhesive layer is cleaned with a cleaning solution to be removed. Patent Literature 1 describes such a cleaning solution, that is, a detergent composition used for cleaning the substrate front surface. The detergent composition contains (A) quaternary ammonium salt: 0.1 to 2.0 mass %, (B) water: 0.1 to 4.0 mass %, and (C) an organic solvent: 94.0 to 99.8 mass %.

CITATION LIST

Patent Literature

Patent Literature 1: Japanese Patent Application Laid-open No. 2015-7217

SUMMARY

Technical Problem

However, the cleaning solution described in Patent Literature 1 has room for improvement in detergency for the temporary adhesive layer remaining on the substrate front surface.

The present invention was made in view of the above-described situation, and it is an object thereof to provide a cleaning solution having excellent detergency for a temporary adhesive layer remaining on a substrate front surface.

Solution to Problem

To solve the above problem and to achieve the above objection, a cleaning solution for temporary adhesive for substrates according to one aspect of the invention includes tetrabutylammonium fluoride; dimethyl sulfoxide; and a liquid compound having a solubility parameter of 8.0 or more and 10.0 or less and having a heteroatom.

It is preferable that the tetrabutylammonium fluoride is contained at a content of 1 mass % or more and 15 mass % or less in 100 mass % of a total of the tetrabutylammonium fluoride, the dimethyl sulfoxide, and the liquid compound.

It is preferable that the dimethyl sulfoxide is contained at a content of 5 mass % or more and 30 mass % or less in 100 mass % of a total of the tetrabutylammonium fluoride, the dimethyl sulfoxide, and the liquid compound.

It is preferable that the liquid compound is a compound having a ketone group or an ester group.

A substrate cleaning method according to another aspect of the invention includes steps of: separating a support from a substrate laminate including the support, a temporary adhesive layer formed on the support, and a substrate laminated on the temporary adhesive layer and having a front surface on which a circuit is formed and that faces the temporary adhesive layer; and cleaning and removing the temporary adhesive layer remaining on the substrate with the cleaning solution for temporary adhesive for substrates.

A cleaning method for a support or a substrate according to still another aspect of the invention includes steps of: forming a temporary adhesive layer on a support or a substrate; and cleaning and removing a part of the temporary adhesive layer with the cleaning solution for temporary adhesive for substrates.

Advantageous Effects of Invention

According to the present invention, the cleaning solution having excellent detergency for the temporary adhesive layer remaining on the substrate front surface can be provided.

BRIEF DESCRIPTION OF DRAWINGS

FIG. 1 is a diagram for describing a substrate laminate.

DESCRIPTION OF EMBODIMENTS

The present invention will now be described in detail.
<Cleaning Solution for Temporary Adhesive for Substrates>

A cleaning solution for temporary adhesive for substrates according to an embodiment contains tetrabutylammonium fluoride, dimethyl sulfoxide, and a liquid compound having a solubility parameter of 8.0 or more and 10.0 or less and having a heteroatom.

To perform a step of grinding the back surface of a substrate on which a semiconductor circuit has been formed, for example, the substrate and a support are bonded with a temporary adhesive layer including the temporary adhesive for substrates interposed therebetween. Specifically, as the temporary adhesive for substrates, a silicone-based adhesive is used. After completing the step of grinding the back surface, for example, when the support has been separated, a part of the temporary adhesive for substrates that forms the temporary adhesive layer may remain on the substrate front surface. The cleaning solution for temporary adhesive for substrates according to the embodiment is preferably used for cleaning such temporary adhesive for substrates remaining on the substrate front surface. When the cleaning solution for temporary adhesive for substrates according to the embodiment is used for cleaning, the remaining temporary adhesive for substrates (i.e., the silicone-based adhesive) can be sufficiently removed. This can be achieved because the tetrabutylammonium fluoride and the dimethyl sulfoxide are used in combination in the cleaning solution for temporary adhesive for substrates according to the embodiment. It should be noted that the cleaning solution for temporary adhesive for substrates according to the embodiment can preferably clean not only the substrate that has been thinned by the step of grinding the back surface but also the temporary adhesive for substrates remaining on the substrate front surface.

The liquid compound contained in the cleaning solution has a solubility parameter of 8.0 or more and 10.0 or less. The solubility parameter is preferably 8.0 or more and 9.5 or less. Herein, the solubility parameter (SP value, δ) is a parameter defined in the regular solution theory introduced by Hildebrand and Scott. This solubility parameter is expressed as $\delta=(\Delta E/V)^{1/2}(cal/cm^3)^{1/2}$, where V is the molecular volume of a solvent and ΔE is a cohesive energy (evaporation energy).

The liquid compound has a heteroatom. Examples of the heteroatom include an oxygen atom. Specifically, the liquid compound is preferably a compound having a ketone group (—C(═O)—) or an ester group (—O—C(═O)—). The liquid compound is easily mixed with the silicone-based adhesive and can sufficiently remove the silicone-based adhesive because it has a solubility parameter within the above-described range and has a specific heteroatom (e.g., the above-described groups).

Examples of the liquid compound specifically include methyl isobutyl ketone (δ=8.4), methyl isopropyl ketone (δ=8.5), methyl n-propyl ketone (δ=8.7), methyl ethyl ketone (δ=9.3), cyclohexanone (δ=9.9), acetone (δ=10.0), isobutyl acetate (δ=8.3), n-butyl acetate (δ=8.5), ethyl acetate (δ=9.1), and propylene glycol monomethyl ether acetate (δ=9.1). The liquid compound may be used alone, or may be used in combination of two or more kinds thereof. Among these, in respect of detergency for the silicone-based adhesive, n-butyl acetate and propylene glycol monomethyl ether acetate are more preferable.

In the cleaning solution for temporary adhesive for substrates according to the embodiment, the tetrabutylammonium fluoride is preferably contained at a content of 1 mass % or more and 15 mass % or less in 100 mass % of a total of the tetrabutylammonium fluoride, the dimethyl sulfoxide, and the liquid compound. The content is more preferably 3 mass % or more and 15 mass % or less. When the tetrabutylammonium fluoride is contained within the above-described range, the silicone-based adhesive can be sufficiently removed. If the content is less than 1 mass %, cleaning may be insufficient. If the content exceeds 15 mass %, the substrate may be corroded.

In the cleaning solution for temporary adhesive for substrates according to the embodiment, the dimethyl sulfoxide is preferably contained at a content of 5 mass % or more and 30 mass % or less in 100 mass % of a total of the tetrabutylammonium fluoride, the dimethyl sulfoxide, and the liquid compound. The content is more preferably 10 mass % or more and 30 mass % or less. When the dimethyl sulfoxide is contained within the above-described range, the silicone-based adhesive can be sufficiently removed. If the content is less than 5 mass %, cleaning may be insufficient. If the content exceeds 30 mass %, the substrate may be corroded.

The cleaning solution for temporary adhesive for substrates according to the embodiment may contain, as other components, a surfactant, a chelating agent, an antioxidant, an anticorrosive, a defoaming agent, a pH adjuster, and an aromatic compound. Specific examples of the surfactant include polyether-based nonionic surfactants although they may be any of nonionic, anionic, and cationic ones. The other components may be used alone, or may be used in combination of two or more kinds thereof. The other components when being added, for example, may be contained each in an amount of 0.01 part by mass or more and 10 parts by mass or less with respect to 100 parts by mass of a total of the tetrabutylammonium fluoride, the dimethyl sulfoxide, and the liquid compound.

A method of preparing the cleaning solution for temporary adhesive for substrates according to the embodiment is not limited to a particular one. The cleaning solution for temporary adhesive for substrates according to the embodiment is obtained by mixing the above-described components, for example. The order in which the components are mixed is not limited to a particular one.

The flash point of the cleaning solution for temporary adhesive for substrates according to the embodiment is preferably 21° C. or higher. When the flash point is within the above-described range, cleaning with the above-described cleaning solution can be performed safely.

<Substrate Cleaning Method>

A substrate cleaning method according to the embodiment includes steps of: separating a support from a substrate laminate including the support, a temporary adhesive layer formed on the support, and a substrate laminated on the temporary adhesive layer and having a front surface on which a circuit is formed and that faces the temporary adhesive layer; and cleaning and removing the temporary adhesive layer remaining on the substrate with the above-described cleaning solution for temporary adhesive for substrates. When the above-described cleaning solution for temporary adhesive for substrates is used, the temporary adhesive layer remaining on the substrate (i.e., out of the silicone-based adhesive forming the temporary adhesive layer, the silicone-based adhesive remaining on the substrate) can be sufficiently removed.

Specifically, the substrate cleaning method according to the embodiment includes steps of: (a) preparing a substrate laminate; (b) grinding or polishing the back surface of a substrate in the substrate laminate; (c) processing the back surface of the substrate; (d) separating a support from the substrate laminate; and (e) cleaning the front surface of the substrate with the cleaning solution for temporary adhesive for substrates. Herein, a case will be described in which the temporary adhesive layer is formed by a cured layer (A) obtained by curing an uncured composition layer of thermosetting organopolysiloxane.

[Step (a)]

The step (a) is a step of preparing a substrate laminate. FIG. 1 is a diagram for presenting the substrate laminate. FIG. 1 illustrates a sectional view of a substrate laminate 10, and the substrate laminate 10 includes a support 1, a temporary adhesive layer 2 formed on the support 1, and a substrate 3 laminated on the temporary adhesive layer 2 and having a front surface on which a circuit is formed and that faces the temporary adhesive layer 2.

Specifically, at step (a), a circuit-forming surface of the substrate that has the circuit-forming surface on the front surface and a non-circuit-forming surface on the back surface is bonded to the support with the temporary adhesive layer (cured layer (A)) interposed therebetween. More specifically, step (a) includes steps of: (a-1) laminating, on the support, an uncured composition layer of thermosetting organopolysiloxane and thermoplastic organopolysiloxane as the silicone-based adhesive; (a-2) bonding the support and the substrate with the uncured composition layer interposed therebetween; and (a-3) heat curing the uncured composition layer to obtain a cured layer (A). Herein, step (a-1) may be step (a-1') of laminating the uncured composition layer on the substrate, and step (a-2) may be step (a-2') of bonding the substrate and the support with the uncured composition layer obtained at step (a-1') interposed therebetween.

At step (a-1) or (a-1'), when the uncured composition layer is laminated, a film of an uncured composition may be used. Alternatively, a solution of an uncured composition may be laminated by spin coating, slit coating, spray coating, or the like. The solution is laminated preferably by spin coating. In this case, generally, after spin coating, prebaking is performed at a temperature of 80° C. or higher and 250° C. or lower, and preferably at 100° C. or higher and 230° C. or lower, depending on the volatile conditions of the solvent contained in the uncured composition.

At step (a-1) or (a-1'), the uncured composition layer is preferably formed so as to have a film thickness of 10 μm or more and 150 μm or less. When the film thickness is 10 μm or more, the substrate and the support can be bonded without gaps to sufficiently withstand the grinding step described later. If the thickness is 150 μm or less, the resin can be prevented from deforming in a heat treatment step such as a TSV formation step described later, and can be put to practical use.

At step (a-2) or (a-2'), the substrate is uniformly compressed under reduced pressure at a temperature of, for example, 40° C. or higher and 250° C. or lower, and more preferably 60° C. or higher and 200° C. or lower, whereby the support and the substrate are bonded. For the bonding, a commercially available wafer-bonding apparatus such as EVG520 IS and EVG850 TB (product name) manufactured by EV Group, XBC300 (product name) manufactured by SUSS MicroTec AG, and Synapse V (product name) manufactured by Tokyo Electron Ltd. is used.

At step (a-3), the uncured composition layer is heated at a temperature of, for example, 120° C. or higher and 250° C. or lower, and preferably 140° C. or higher and 200° C. or lower, for 10 minutes or more and 4 hours or less, and preferably for 30 minutes or more and 2 hours or less, whereby the thermosetting organopolysiloxane is cured.

The substrate used at step (a) is typically a semiconductor wafer. Examples of the semiconductor wafer include a silicon wafer, a germanium wafer, a gallium-arsenide wafer, a gallium-phosphide wafer, and a gallium-arsenide-aluminum wafer. The thickness of the wafer is typically, but is not limited to, 600 μm or more and 800 μm or less, and more typically 625 μm or more and 775 μm or less.

Examples of the support used at step (a) include a substrate such as a silicon wafer, a glass plate, and a quartz wafer.

Hereinafter, the uncured composition of thermosetting organopolysiloxane in particular and the cured layer (A) containing the cured product thereof to be used at step (a) will be described in more detail.

(Uncured Composition)

The uncured composition contains for example: (A-1) organopolysiloxane having two or more alkenyl groups per molecule; (A-2) organohydrogenpolysiloxane having two or more silicon-bonded hydrogen atoms (Si—H groups) per molecule; and (A-3) a platinum-based catalyst. Herein, the mole ratio of the Si—H group in the component (A-2) to the alkenyl group in the component (A-1) is 0.3 or more and 10 or less. The uncured composition may also contain (A-4) an organic solvent or (A-5) a reaction controlling agent.

The component (A-1) is organopolysiloxane having two or more alkenyl groups per molecule. The component (A-1) is, for example, linear or branched diorganopolysiloxane having two or more alkenyl groups per molecule, or organopolysiloxane having a resin structure having a siloxane unit (Q unit) expressed as a $SiO_{4/2}$ unit. The component (A-1) is preferably organopolysiloxane containing the alkenyl groups at 0.6 mol % or more and 9 mol % or less per molecule (mole of alkenyl group/mole of Si).

Specifically, the organopolysiloxane described above is represented by the following formulae (1), (2), and (3). These may be used alone, or may be used in combination of two or more kinds thereof.

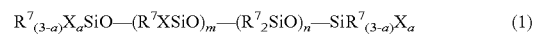

$$R^7{}_{(3-a)}X_aSiO—(R^7XSiO)_m—(R^7{}_2SiO)_n—SiR^7{}_{(3-a)}X_a \quad (1)$$

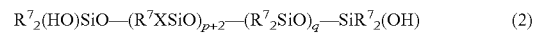

$$R^7{}_2(HO)SiO—(R^7XSiO)_{p+2}—(R^7{}_2SiO)_q—SiR^7{}_2(OH) \quad (2)$$

$$(SiO_{4/2})_b(R^7{}_3SiO_{1/2})_c(R^7{}_{(3-e)}X_eSiO_{1/2})_d \quad (3)$$

In the above formulae, $R^7$ is independently a monovalent hydrocarbon group having no aliphatic unsaturated bond; X is independently a monovalent organic group containing an alkenyl group; "a" is an integer of 0 to 3; m, n are such numbers that 2a+m allows the content of the alkenyl group to be 0.6 mol % or more and 9 mol % or less per molecule; p, q are such numbers that p+2 allows the content of the alkenyl group to be 0.6 mol % or more and 9 mol % or less per molecule; e is independently an integer of 1 to 3; and b, c, d are such numbers that (c+d)/b is 0.3 to 3.0 and that d/(b+c+d) is 0.01 to 0.6.

In the above formulae, $R^7$ is preferably a monovalent hydrocarbon group having 1 to 10 carbon atoms. Specifically, examples of $R^7$ include: alkyl groups such as a methyl group, an ethyl group, a propyl group, and a butyl group; cycloalkyl groups such as a cyclohexyl group; and aryl groups such as a phenyl group and a tolyl group. Among these, alkyl groups and a phenyl group are preferable.

X is preferably an organic group having 2 to 10 carbon atoms. Examples of X include: alkenyl groups such as a vinyl group, an allyl group, a hexenyl group, and an octenyl group; (meth)acryloylalkyl groups such as an acryloylpropyl group, an acryloylmethyl group, and a methacryloylpropyl group; (meth)acryloxyalkyl groups such as an acryloxypropyl group, an acryloxymethyl group, a methacryloxypropyl group, and a methacryloxymethyl group; a cyclohexenyl-ethyl group; and a vinyloxypropyl group. Among these, a vinyl group is industrially preferable.

In the above formula (1), when "a" is 1 to 3, terminals of the molecular chain are blocked with alkenyl groups. The reaction can be completed within a short time by the alkenyl groups with good reactivity at the terminals of the molecular chain. Furthermore, a=1 is industrially preferred in view of the cost. This alkenyl group-containing diorganopolysiloxane is preferably in an oil state or a crude rubber state.

The above formula (3) represents organopolysiloxane having a resin structure. In the above formula (3), e=1 is industrially preferred in view of the cost. The product of the average of e and d/(b+c+d) is preferably 0.02 to 1.50, and more preferably 0.03 to 1.0. This organopolysiloxane having a resin structure may be used as a solution dissolved in an organic solvent.

The component (A-2) is a crosslinker, which is organohydrogenpolysiloxane having at least two, more preferably three or more, silicon-bonded hydrogen atoms (Si—H groups) per molecule. This organohydrogenpolysiloxane has a linear, branched, or cyclic structure.

The viscosity of the component (A-2) at 25° C. is preferably 1 mPa·s or more and 5,000 mPa·s or less, and more preferably 5 mPa·s or more and 500 mPa·s or less. This organohydrogenpolysiloxane may be used alone, or may be used in combination of two kinds thereof.

The component (A-2) is desired to be blended in such an amount that the mole ratio of the Si—H group in the component (A-2) to the alkenyl group in the component (A-1) (Si—H group/alkenyl group) is preferably 0.3 or more and 10 or less, and more preferably 1.0 or more and 8.0 or less. When this mole ratio is 0.3 or more, the crosslinking density is not excessively reduced, and the uncured composition layer can be preferably cured. When the mole ratio is 10 or less, the crosslinking density is not excessively increased, and sufficient viscosity and tackiness can be achieved. In addition, the mole ratio of 10 or less can make the available time of the uncured composition longer.

The component (A-3) is a platinum-based catalyst (i.e., platinum group metal catalyst). Examples of the platinum-based catalyst include chloroplatinic acid, an alcohol solution of chloroplatinic acid, a reaction product of chloroplatinic acid with alcohol, a reaction product of chloroplatinic acid with an olefin compound, and a reaction product of chloroplatinic acid with a vinyl group-containing siloxane. The platinum-based catalyst may be used alone, or may be used in combination of two or more kinds thereof.

The component (A-3) is desired to be blended in an amount of preferably 1 ppm or more and 5,000 ppm or less, and more preferably 5 ppm or more and 2,000 ppm or less in terms of (the mass of) platinum with respect to the total of the component (A-1) and the component (A-2). When the amount is 1 ppm or more, curability of the uncured composition layer is less likely to decrease. Thus, decrease in crosslinking density and also decrease in holding force can be suppressed. The amount of 5,000 ppm or less can make the available time of the uncured composition longer.

The component (A-4) is an organic solvent. The organic solvent is not limited to a particular one if it can dissolve the component of the uncured composition. Examples of the organic solvent include hydrocarbon solvents such as pentane, hexane, cyclohexane, isooctane, nonane, decane, p-menthane, pinene, isododecane, and limonene, and a silicone-based solvent. The organic solvent may be used alone, or may be used in combination of two or more kinds thereof.

When the component (A-4) is used, the component (A-4) is desired to be blended in an amount of preferably 10 parts by mass or more and 900 parts by mass or less, more preferably 25 parts by mass or more and 400 parts by mass or less, and still more preferably 40 parts by mass or more and 300 parts by mass or less with respect to 100 parts by mass of a total of the component (A-1) and the component (A-2).

The component (A-5) is a reaction controlling agent. With the reaction controlling agent, when the uncured composition is prepared or the uncured composition is applied to the base, the uncured composition can be prevented from thickening or gelling before heat curing.

Examples of the reaction controlling agent include: 3-methyl-1-butyn-3-ol, 3-methyl-1-pentyn-3-ol, 3,5-dimethyl-1-hexyn-3-ol, 1-ethynylcyclohexanol, 3-methyl-3-trimethylsiloxy-1-butyne, 3-methyl-3-trimethylsiloxy-1-pentyne, 3,5-dimethyl-3-trimethylsiloxy-1-hexyne, 1-ethynyl-1-trimethylsiloxycyclohexane, bis(2,2-dimethyl-3-butynoxy)dimethylsilane, 1,3,5,7-tetramethyl-1,3,5,7-tetravinylcyclotetrasiloxane, and 1,1,3,3-tetramethyl-1,3-divinyldisiloxane. Among these, 1-ethynylcyclohexanol and 3-methyl-1-butyn-3-ol are preferable. The reaction controlling agent may be used alone, or may be used in combination of two or more kinds thereof.

When the component (A-5) is used, the component (A-5) is desired to be blended in an amount of preferably 0.01 part by mass or more and 8.0 parts by mass or less, and more preferably 0.05 part by mass or more and 2.0 parts by mass or less with respect to 100 parts by mass of a total of the component (A-1) and the component (A-2). When the amount is 8.0 parts by mass or less, curability of the uncured composition layer is less likely to decrease. When the amount is 0.01 part by mass or more, the effect of controlling the reaction can be sufficiently exhibited.

The uncured composition may further contain other components. Examples of the components include: a filler such as silica; unreactive polyorganosiloxanes such as polydimethyl siloxane and polydimethyldiphenyl siloxane; antioxidants of a phenol type, a quinone type, an amine type, a phosphorus type, a phosphite type, a sulfur type, a thioether type, or other types; photo stabilizers of a triazole type, a benzophenone type, or other types; flame retardants of a phosphoric acid ester type, a halogen type, a phosphorus type, an antimony type, or other types; and antistatic agents such as a cationic activator, an anionic activator, and a nonionic activator. The other components may be used alone, or may be used in combination of two or more kinds thereof.

The other components are blended within a range not impairing the object of the present invention. For example, when a filler is used to increase the heat resistance, the filler is preferably blended in an amount of 50 parts by mass or less with respect to 100 parts by mass of a total of the component (A-1) and the component (A-2).

(Cured Layer (A))

The cured layer (A) is obtained by heat curing the uncured composition layer, and contains a cured product of the uncured composition as described above.

The cured layer (A) laminated on the support, when being interfacially peeled from the support, exhibits a peeling force of, for example, 10 mN/25 mm or more and 500 mN/25 mm or less, preferably 30 mN/25 mm or more and 500 mN/25 mm or less, and more preferably 50 mN/25 mm or more and 200 mN/25 mm or less. The peeling force herein is a peeling force obtained in a 180° peel test in which a test piece having a width of 25 mm is pulled up at 5 mm/s to be peeled. When it is 10 mN/25 mm or more, separation during a processing step and the like described later can be prevented. When it is 500 mN/25 mm or less, the cured layer (A) can be easily removed from the support.

The cured layer (A) laminated on the substrate, when being interfacially peeled from the substrate, exhibits a peeling force of, for example, 50 mN/25 mm or more and 1,000 mN/25 mm or less, preferably 70 mN/25 mm or more and 1,000 mN/25 mm or less, and more preferably 80 mN/25 mm or more and 500 mN/25 mm or less. Herein, the peeling force is a peeling force obtained in a 180° peel test in which a test piece having a width of 25 mm is pulled up at 5 mm/s to be peeled. When it is 50 mN/25 mm or more, separation during a processing step and the like described later can be prevented. Separation is less likely to occur even though a high temperature process in particular. When the peeling force is 1,000 mN/25 mm or less, the cured layer (A) can be removed from the substrate by a tape.

The cured product contained in the cured layer (A) preferably contains a siloxane unit (M unit) expressed as $R^1R^2R^3SiO_{1/2}$ at 0.001 mol % or more and 60.000 mol % or less, a siloxane unit (D unit) expressed as $R^4R^5SiO_{2/2}$ at 10.000 mol % or more and 99.999 mol % or less, a siloxane unit (T unit) expressed as $R^6SiO_{3/2}$ at 0.000 mol % or more and 0.005 mol % or less, and a siloxane unit (Q unit) expressed as $SiO_{4/2}$ at 0.000 mol % or more and 60.000 mol % or less. It is more preferable that the cured product contain the M unit at 0.001 mol % or more and 35.000 mol % or less, the D unit at 30.000 mol % or more and 99.999 mol % or less, the T unit at 0.000 mol % more and 0.001 mol % or less, and the Q unit at 0.000 mol % or more and 50.000 mol % or less.

Herein, $R^1$, $R^2$, $R^3$, $R^4$, $R^5$ and $R^6$ are organic substituents, which are unsubstituted or substituted monovalent hydrocarbon groups. These hydrocarbon groups each preferably have 1 to 10 carbon atoms. Specifically, examples of the hydrocarbon groups include: alkyl groups such as a methyl group, an ethyl group, an n-propyl group, an isopropyl group, an n-butyl group, a t-butyl group, an n-pentyl group, a cyclopentyl group, and an n-hexyl group; cycloalkyl groups such as a cyclohexyl group; aryl groups such as a phenyl group and a tolyl group; and groups in which a part or all of the hydrogen atoms of the above groups are substituted by halogen atoms. Among these, a methyl group and a phenyl group are preferable.

The storage elastic modulus of the cured layer (A) at 25° C. is preferably $1 \times 10^6$ Pa or more and $1 \times 10^9$ Pa or less. When the storage elastic modulus is within this range, the substrate can withstand the grinding step described later, and warpage thereof can be reduced. Thus, a problem such as poor fit to a device at a step is less likely to occur.

[Step (b)]

Step (b) is a step of grinding or polishing the back surface of the substrate in the substrate laminate. At step (b), the back surface (non-circuit-forming surface) of the substrate bonded to the support is ground or polished. By this step, the thickness of the substrate is reduced. The thickness of the thinned substrate is typically 5 µm or more and 300 µm or lees, and more typically 10 µm or more and 100 µm or less. The technique for grinding is not limited to a particular one, and known techniques may be used. The grinding is preferably performed while water is fed to the substrate and a grinding wheel (e.g., diamond) for cooling. Examples of an apparatus for grinding the back surface of the substrate include DAG-810 (product name) manufactured by DISCO Co., Ltd. The back surface of the substrate may be subjected to CMP polishing.

[Step (c)]

Step (c) is a step of processing the back surface of the substrate. At step (c), the back surface (non-circuit-forming surface) of the substrate that has been thinned by grinding the back surface or polishing the back surface at step (b) is processed. This step includes various processes applied in the wafer level. Examples of this step include electrode formation, metal wiring formation, and protective film formation. More specifically, the examples include well-known processes such as metal sputtering for forming electrodes or the like, wet etching for etching a sputtered metal layer, a process in which a resist is applied and subjected to exposure and development to form a pattern used as a mask for metal wiring formation, resist peeling, dry etching, plating with metal, silicon etching for forming a TSV, and formation of an oxide film on a silicon surface. The examples also include a process in which the wafer thinned by dicing or the like is cut into chips.

[Step (d)]

Step (d) is a step of separating the support from the substrate laminate. At step (d), the support is separated from the substrate laminate processed at step (c). This separating step is generally performed under relatively low temperature conditions from room temperature to about 60° C. This step can be performed by horizontally fixing one of the substrate and the support of the substrate laminate and lifting the other at a certain angle with respect to the horizontal direction. Alternatively, a protective film may be bonded to the ground surface of the substrate, and then the substrate together with the protective film may be separated by peeling.

Specifically, this peeling includes steps of: (d-1) bonding a dicing tape to the processed surface of the processed substrate; (d-2) attaching a dicing tape surface by vacuum suction to a suction surface; (d-3) separating the support from the substrate by peeling-off at a temperature of the suction surface in the range of 10° C. or higher and 100° C. or lower. In this case, the support can be easily separated from the substrate, and the subsequent dicing step can be easily performed.

By this separating step, the cured layer (A) together with the support is separated from the substrate laminate, whereby only the substrate is obtained. Other than this case, there is a case in which only the support is separated from the substrate laminate, whereby the substrate on which the cured layer (A) is laminated is obtained. In the latter case, the cured layer (A) is further separated from the substrate by tape peeling, whereby only the substrate is obtained. As a tape to be used for tape peeling, a tape using silicone adhesive is preferable. For example, polyester film adhesive tapes No. 646S and No. 648 manufactured by Teraoka Seisakusho Co., Ltd. are preferably used.

[Step (e)]

Step (e) is a step of cleaning the front surface of the substrate with the above-described cleaning solution for temporary adhesive for substrates. At step (e), with the cleaning solution for temporary adhesive for substrates, the cured layer (A) (the cured product of the uncured composition) remaining on the front surface (circuit-forming surface) of the substrate is cleaned and removed. By this step, the cured layer (A) that partially remains on the front surface of the substrate even after the support and the cured layer (A) have been separated at step (d) can be sufficiently removed. This substrate (thinned wafer) is preferably used subsequently for a three-dimensional semiconductor mounting process.

This cleaning may be performed with the substrate being immersed in the cleaning solution for temporary adhesive for substrates. This immersing time is approximately, for example, 10 seconds or more and 30 minutes or less, and preferably 30 seconds or more and 10 minutes or less. Alternatively, the cleaning may be performed with the substrate being sprayed with the cleaning solution for temporary adhesive for substrates. Furthermore, the cleaning may be performed by paddling with the cleaning solution for temporary adhesive for substrates, and shaking or ultrasonic cleaning may be performed. The temperature for the cleaning is, for example, 10° C. or higher and 50° C. or lower, and preferably 20° C. or higher and 40° C. or lower.

Herein, the substrate after being cleaned may be rinsed with water or alcohol and dried.

In the substrate cleaning method according to the embodiment described above, at step (a), the uncured composition layer of thermosetting organopolysiloxane is cured to form the cured layer (A) as the temporary adhesive layer. Alternatively, as the temporary adhesive layer, which is not limited to the cured layer (A), a temporary adhesive layer obtained from another silicone-based adhesive may be used. Although the cured layer (A) has a single layer, two or more temporary adhesive layers may be formed. The temporary adhesive layer on the cured layer (A) may be, although not limited to, silicone-based, acrylic, or phenolic, for example. In addition, a layer containing organopolysiloxane having a function other than the temporary adhesive layer may be formed between the support and the substrate. Specifically, examples of the other silicone-based adhesive include silicone-based adhesives described in International Publication No. WO2015/115060, Japanese Patent Application Laid-open No. 2012-144616, Japanese Patent Application Laid-open No. 2014-131004. In any cases, if the cleaning solution for temporary adhesive for substrates is used, the temporary adhesive layer remaining on the substrate front surface can be sufficiently removed.

In the substrate cleaning method according to the embodiment, at step (d), the support may be separated as described above. However, this separation of the support may be performed by photo peeling, heat peeling, solvent peeling, or mechanical peeling. In any cases, if the cleaning solution for temporary adhesive for substrates is used, the temporary adhesive layer remaining on the substrate front surface can be sufficiently removed.

In photo peeling, generally, at step (a), a separation layer is formed in the substrate laminate in advance. Specifically, the separation layer is formed between the support and the temporary adhesive layer. The separation layer is formed of, for example, a known material that absorbs light radiated through the support to deteriorate, such as, although not limited to, carbon and an aromatic hydrocarbon compound. The deterioration means a state in which the separation layer is broken by a slight external force or a state in which adhesive strength between the separation layer and a layer that is in contact therewith has decreased. Subsequently, step (b) and step (c) are performed on the substrate laminate having the separation layer as described above. Subsequently, at step (d), the support is separated from the substrate laminate by photo peeling. Herein, light is radiated on substrate laminate through the support from a known laser. In this case, a laser configured to radiate light having a wavelength that can cause materials forming the separation layer to deteriorate may be appropriately selected. By this radiation, the separation layer deteriorates, and the support is separated. Subsequently, at step (e), with the cleaning solution for temporary adhesive for substrates, the front surface of the substrate obtained by the photo peeling is cleaned.

In heat peeling, generally, at step (a), a silicone-based adhesive the adhesive strength of which is reduced by heating is used to form a temporary adhesive layer in advance. Subsequently, step (b) and step (c) are performed on the substrate laminate having this temporary adhesive layer as described above. Subsequently, at step (d), the support is separated from the substrate laminate by heat peeling. Subsequently, at step (e), with the cleaning solution for temporary adhesive for substrates, the front surface of the substrate obtained by the heat peeling is cleaned.

In solvent peeling, at step (d), the support is separated from the substrate laminate by solvent peeling. In this case, a solvent that can dissolve the silicone-based adhesive forming the temporary adhesive layer may be appropriately selected, and examples thereof include solvents of a hydrocarbon type having 4 to 20 carbon atoms, an aromatic type, and an ether type. Subsequently, at step (e), with the cleaning solution for temporary adhesive for substrates, the front surface of the substrate obtained by the solvent peeling is cleaned.

In the substrate cleaning method according to the embodiment described above, at step (a), the whole surface of the circuit-forming surface of the substrate is bonded to the support with the temporary adhesive layer obtained from the uncured composition of one type interposed therebetween. Instead of this, to adjust the bonding strength between the support and the substrate, a first temporary adhesive layer may be formed on a part of the substrate front surface, and a second temporary adhesive layer may be formed on the remaining part of the substrate front surface. In other words, the whole surface of the substrate front surface may be covered by the first temporary adhesive layer and the second temporary adhesive layer. Silicone-based adhesives that are suitable for the respective layers to obtain a desired bonding strength are selected to form the first temporary adhesive layer and the second temporary adhesive layer.

Furthermore, in this case, when the temporary adhesive layer is formed, the above-described cleaning solution for temporary adhesive for substrates is preferably used. To begin with, the first temporary adhesive layer is formed on the whole surface of the substrate. Subsequently, with the cleaning solution for temporary adhesive for substrates, an unnecessary part of the first temporary adhesive layer (a part on which the second temporary adhesive layer is to be formed) is subjected to an edge-cut treatment. When the cleaning solution for temporary adhesive for substrates is used, the unnecessary part of the first temporary adhesive layer can be cleanly removed from the substrate. On this edge-cut part, the second temporary adhesive layer is formed. The circuit-forming surface of the substrate is then bonded to the support with the first temporary adhesive layer and the second temporary adhesive layer interposed therebetween. Subsequently, at step (b), the back surface of the substrate in the substrate laminate having the first temporary adhesive layer and the second temporary adhesive layer is ground or polished. In the foregoing, the temporary adhesive layer is formed on the substrate. However, the temporary adhesive layer may be formed on the support. Specifically, as described above, a cleaning method for a support or a substrate according to the embodiment includes steps of: forming the temporary adhesive layer on the support or the substrate; and cleaning and removing a part of the temporary adhesive layer with the above-described cleaning solution for temporary adhesive for substrates.

The present invention is not limited to the above-described embodiment. Those configured by appropriately combining the respective constitutional elements described above are also included in the present invention. Furthermore, additional effects or modifications can be easily derived by the skilled person. Thus, a wider aspect of the present invention is not limited to the above-described embodiment, and various changes may be made.

EXAMPLES

Hereinafter, the present invention will be specifically described with reference to Examples, but the present invention is not limited to these Examples.

<Cleaning Solution for Temporary Adhesive for Substrates>

Example 1-1

Tetrabutylammonium fluoride and dimethyl sulfoxide were added to propylene glycol monomethyl ether acetate, and the resulting mixture was stirred at room temperature to obtain a cleaning solution (1-1). In the cleaning solution (1-1), the tetrabutylammonium fluoride was dissolved. Here, the cleaning solution was prepared such that the tetrabutylammonium fluoride was contained at a content of 10 mass % in 100 mass % of a total of the tetrabutylammonium fluoride, the dimethyl sulfoxide, and the propylene glycol monomethyl ether acetate. The cleaning solution was also prepared such that the dimethyl sulfoxide was contained at a content of 20 mass % in 100 mass % of a total of the tetrabutylammonium fluoride, the dimethyl sulfoxide, and the propylene glycol monomethyl ether acetate.

Example 1-2

The same preparation was performed as in Example 1-1 except that butyl acetate was used instead of the propylene glycol monomethyl ether acetate, whereby a cleaning solution (1-2) was obtained.

Example 1-3

The same preparation was performed as in Example 1-1 except that cleaning solution was prepared such that the tetrabutylammonium fluoride is contained at 5 mass % in 100 mass % of a total of the tetrabutylammonium fluoride, the dimethyl sulfoxide, and the propylene glycol monomethyl ether acetate, whereby a cleaning solution (1-3) was obtained.

Example 1-4

Tetrabutylammonium fluoride and dimethyl sulfoxide were added to propylene glycol monomethyl ether acetate, and the resulting mixture was stirred at room temperature to obtain a cleaning solution (1-4). In the cleaning solution (1-4), the tetrabutylammonium fluoride was dissolved. Here, the cleaning solution was prepared such that the tetrabutylammonium fluoride is contained at a content of 10 mass % in 100 mass % of a total of the tetrabutylammonium fluoride, the dimethyl sulfoxide, and the propylene glycol monomethyl ether acetate. The cleaning solution was also prepared such that the dimethyl sulfoxide is contained at a content of 10 mass % in 100 mass % of a total of the tetrabutylammonium fluoride, the dimethyl sulfoxide, and the propylene glycol monomethyl ether acetate.

Comparative Example 1-1

Dimethyl sulfoxide was added to propylene glycol monomethyl ether acetate, and the resulting mixture was stirred at room temperature to obtain a cleaning solution (1-5). Here, the cleaning solution was prepared such that the dimethyl sulfoxide is contained at a content of 20 mass % in 100 mass % of a total of the dimethyl sulfoxide and the propylene glycol monomethyl ether acetate.

<Cleaning of Substrate>

Example 2-1

To begin with, a resin solution was prepared as follows.
A solution consisting of 100 parts by mass of polydimethylsiloxane having 2.5 mol % of vinyl groups at molecular side chains with a number average molecular weight (Mn) of 30,000 and 200 parts by mass of toluene was prepared. To this solution, 40 parts by mass of organohydrogenpolysiloxane represented by formula (M-1) below and 0.7 part by mass of ethynylcyclohexanol were added, and then mixed. Furthermore, 0.2 part by mass of a platinum catalyst CAT-PL-5 (manufactured by Shin-Etsu Chemical Co., Ltd.) was added thereto, and the resulting mixture was filtered through a 0.2-μm membrane filter to obtain a resin solution. In the resin solution, the mole ratio of Si—H groups of organohydrogenpolysiloxane having Si—H groups to alkenyl groups in organopolysiloxane having alkenyl groups was 1.1.

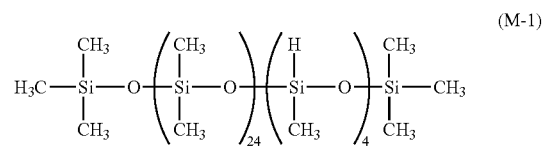

(M-1)

Subsequently, a substrate was cleaned as follows.
[Step (a)]
A substrate laminate was prepared. Specifically, on a 200-mm glass wafer (thickness: 700 μm) as a support, an uncured composition layer (thickness: 35 μm) was laminated by spin coating with the resin solution and then heating with a hot plate at 50° C. for 3 minutes. Subsequently, a 200-mm diameter silicon wafer (thickness: 725 μm) as a substrate, on the entire front surface of which copper posts having a height of 10 μm and a diameter of 40 μm were formed, was bonded to the support such that the copper post surface faces the uncured composition layer surface. The bonding was performed by a wafer-bonding apparatus (EVG520 IS (product name) manufactured by EV Group). The bonding was performed at a bonding temperature of 50° C., under a chamber internal pressure of $10^{-3}$ mbar or less during bonding, with a load of 10 kN. After the bonding, the bonded substrate was heated with an oven at 200° C. for 2 hours, and the uncured composition layer was cured, and was cooled to room temperature. Through these processes, a substrate laminate was obtained.
[Step (b)]
Subsequently, the back surface of the substrate in the substrate laminate was ground. Specifically, the back surface of the silicon wafer was ground by a grinder (DAG810 (product name) manufactured by DISCO Co., Ltd.) with a diamond grinding wheel. It was ground to a final substrate thickness of 50 μm.
[Step (c)]
Subsequently, as a step of processing the back surface of the substrate, a heating step was performed in a simulated condition. Specifically, the substrate laminate for which the back surface had been ground was heated on a hot plate at 260° C. for 10 minutes.
[Step (d)]
Subsequently, the support was separated from the substrate laminate. Specifically, a dicing tape was bonded to the back surface (non-circuit-forming surface) of the silicon wafer with a dicing frame, and this dicing tape surface was set to a suction plate by vacuum suction. Subsequently, one point of the glass wafer was lifted by tweezers at room temperature, whereby the glass wafer was separated. Subsequently, a polyester film adhesive tape No. 648 manufactured by Teraoka Seisakusho Co., Ltd. was bonded to a temporary adhesive layer that had been exposed at the front surface, and tape peeling was performed. In this manner, the temporary adhesive layer was removed from the silicon wafer.

[Step (e)]

Subsequently, with the cleaning solution (1-1), the front surface of the substrate was cleaned. Specifically, the silicon wafer was immersed in the cleaning solution (1-1) for 10 minutes, and was then dried at room temperature.

Example 2-2 to Example 2-4 and Comparative Example 2-1

The same processes were performed as in Example 2-1 except that the cleaning solution (1-2) to the cleaning solution (1-5) were used instead of the cleaning solution (1-1), whereby the substrate was cleaned.

<Evaluation Method>

As a result of measuring by XPS the amount of Si elements that were present on the front surface (circuit-forming surface) of the substrate that had undergone step (d) was measured, the Si content was 23%. Herein, in the Si content, Si derived from a silicon substrate is omitted.

The amount of Si elements that were present on the front surface (circuit-forming surface) of the substrate that had undergone step (e) was also measured by XPS.

When the Si content after the cleaning is less than 5%, the cleaning solution can be considered to have excellent detergency for the temporary adhesive layer remaining on the front surface of the substrate.

Herein, the XPS was performed with an X-ray photoelectron spectroscopy analyzer (PHI Quantera SXM (product name) manufactured by ULVAC-PHI, Inc.). Specifically, it was performed with monochromatized AlKα for the X-ray source at an output of 25 W (15 kV, 100-μm diameter), a photoelectron take-off angle of 45°, a pass energy of 55.0 eV, and a step resolution of 0.05 eV. The analysis area was φ500 μm.

<Evaluation Results>

When substrate cleaning methods as in Examples 2-1 to 2-4 were performed with the cleaning solutions obtained in Examples 1-1 to 1-4, the remaining amount of Si was less than 3% in all cases. In contrast, when substrate cleaning as in Comparative Example 2-1 was performed with the cleaning solution obtained in Comparative Example 1-1 that does not satisfy the requirements of the present invention, the remaining amount of Si remaining after the cleaning was 23%, and thus excellent detergency could not be obtained.

It should be noted that the present invention is not limited to the above-described embodiment. The embodiment is merely exemplification, and any examples that have substantially the same feature and demonstrate the same functions and effects as those in the technical concept described in claims of the present invention are included in the technical scope of the present invention.

REFERENCE SIGNS LIST 1 support
2 temporary adhesive layer (cured layer (A))
3 substrate
10 substrate laminate

The invention claimed is:

1. A cleaning solution for temporary adhesive for substrates, the cleaning solution comprising:
   tetrabutylammonium fluoride; dimethyl sulfoxide; and a liquid compound having a solubility parameter of 8.0 or more and 10.0 or less and having a heteroatom, wherein
   the tetrabutylammonium fluoride is contained at a content of 1 mass % or more and 15 mass % or less in 100 mass % of a total of the tetrabutylammonium fluoride, the dimethyl sulfoxide, and the liquid compound,
   the dimethyl sulfoxide is contained at a content of 5 mass % or more and 30 mass % or less in 100 mass % of a total of the tetrabutylammonium fluoride, the dimethyl sulfoxide, and the liquid compound, and
   the liquid compound comprises propylene glycol monomethyl ether acetate or butyl acetate.

2. A substrate cleaning method comprising steps of:
   separating a support from a substrate laminate comprising the support, a temporary adhesive layer formed on the support, and a substrate laminated on the temporary adhesive layer and having a front surface on which a circuit is formed and that faces the temporary adhesive layer; and
   cleaning and removing the temporary adhesive layer remaining on the substrate with the cleaning solution for temporary adhesive for substrates according to claim 1.

3. A cleaning method for a support or a substrate comprising steps of:
   forming a temporary adhesive layer on a support or a substrate; and
   cleaning and removing a part of the temporary adhesive layer with the cleaning solution for temporary adhesive for substrates according to claim 1.

4. The cleaning solution for temporary adhesive for substrates according to claim 1, wherein the tetrabutylammonium fluoride is contained at a content of 5 mass % or more and 10 mass % or less in 100 mass % of a total of the tetrabutylammonium fluoride, the dimethyl sulfoxide, and the liquid compound, and
   the dimethyl sulfoxide is contained at a content of 10 mass % or more and 20 mass % or less in 100 mass % of a total of the tetrabutylammonium fluoride, the dimethyl sulfoxide, and the liquid compound.

* * * * *